(12) United States Patent
Yoon

(10) Patent No.: US 11,139,028 B2
(45) Date of Patent: Oct. 5, 2021

(54) NONVOLATILE MEMORY APPARATUS FOR MITIGATING DISTURBANCES AND AN OPERATING METHOD OF THE NONVOLATILE MEMORY APPARATUS

(71) Applicant: SK hynix Inc., Icheon-si (KR)

(72) Inventor: Jung Hyuk Yoon, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 38 days.

(21) Appl. No.: 16/803,658

(22) Filed: Feb. 27, 2020

(65) Prior Publication Data
US 2021/0020242 A1    Jan. 21, 2021

(30) Foreign Application Priority Data
Jul. 16, 2019  (KR) .................. 10-2019-0085653

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0004* (2013.01); *G11C 2013/0078* (2013.01)

(58) Field of Classification Search
CPC ............ G11C 13/0069; G11C 13/0004; G11C 13/003; G11C 13/004
USPC .......................................... 365/163
See application file for complete search history.

(56) References Cited

U.S. PATENT DOCUMENTS

| 10,056,136 B2 | 8/2018 | Taub et al. | |
|---|---|---|---|
| 2011/0134685 A1* | 6/2011 | Kau .................. | G11C 13/0004 365/163 |
| 2011/0149628 A1* | 6/2011 | Langtry ............. | G11C 13/0069 365/51 |

* cited by examiner

*Primary Examiner* — Vu A Le
(74) *Attorney, Agent, or Firm* — William Park & Associates Ltd.

(57) ABSTRACT

A nonvolatile memory apparatus may include a write circuit and a sense amplifier. The write circuit may perform a preselection operation on a selected memory cell. When the selected memory cell was snapped back, the write circuit may selectively perform a reset write operation and a set write operation on the selected memory cell according to write data. When the selected memory cell is not snapped back, the write circuit may apply no voltage and no current to the selected memory cell. The sense amplifier may sense whether the selected memory cell was snapped back.

20 Claims, 8 Drawing Sheets

NONVOLATILE MEMORY APPARATUS FOR MITIGATING DISTURBANCES AND AN OPERATING METHOD OF THE NONVOLATILE MEMORY APPARATUS

CROSS-REFERENCES TO RELATED APPLICATION

The present application claims priority under 35 U.S.C. § 119(a) to Korean application number 10-2019-0085653, filed on Jul. 16, 2019, in the Korean Intellectual Property Office, which is incorporated herein by reference in its entirety.

BACKGROUND

1. Technical Field

Various embodiments generally relate to an integrated circuit technology, and more particularly, to a nonvolatile memory apparatus and a system using the same.

2. Related Art

An electronic device may include many electronic components. A computer system, for example, may include a large number of electronic components composed of semiconductors. The computer system may include a memory apparatus. Because DRAM (Dynamic Random Access Memory) can store and output data at high and constant speed and perform random access, DRAM is widely used as a general memory apparatus. However, because DRAM includes memory cells each constituted by a capacitor, the DRAM has a volatile characteristic of losing data stored therein when a supply of power is interrupted. In order to remove such a disadvantage of DRAM, flash memory has been developed. Flash memory includes memory cells each constituted by a floating gate, and thus flash memory has a nonvolatile characteristic of retaining data stored therein, even when a supply of power is interrupted. However, flash memory stores and outputs data at lower speed than DRAM and thus has difficulties in performing random access.

Recently, next-generation memory apparatuses having high operation speed and nonvolatile characteristics have been developed. Examples of next-generation memory apparatuses may include phase change RAM, magnetic RAM, resistive RAM, and ferroelectric RAM. The next-generation memory apparatuses can operate at high speed while having nonvolatile characteristics. In particular, PRAM may include memory cells formed of chalcogenide and may store data by changing the resistance values of the memory cells.

SUMMARY

In an embodiment, a nonvolatile memory apparatus may include a write circuit and a sense amplifier. The write circuit may be configured to apply a preselection voltage to a selected memory cell based on a write signal, apply one of a reset write voltage and a set write voltage to the selected memory cell based on write data when the selected memory cell was snapped back, and interrupt a voltage and current applied to the selected memory cell when the selected memory cell is not snapped back. The sense amplifier may be configured to sense whether the selected memory cell was snapped back.

In an embodiment, an operating method of a nonvolatile memory apparatus may include applying a preselection voltage to a selected memory cell. The preselection voltage may have a voltage corresponding to a reset distribution maximum voltage. The operating method may also include sensing whether the selected memory cell was snapped back. The operating method may further include selectively performing a reset write operation and a set write operation on the selected memory cell, based on write data and whether the selected memory cell was snapped back, and interrupting the preselection voltage applied to the selected memory cell.

In an embodiment, a nonvolatile memory apparatus may include a write control circuit, a sense amplifier, and a write driver. The write control circuit may be configured to generate a preselection signal based on a write signal, generate one of a reset write signal and a set write signal when a sensing signal is enabled, and disable the preselection signal and generate none of the reset write signal and the set write signal, when the sensing signal is disabled. The sense amplifier may be configured to sense whether a memory cell was snapped back, and generate the sensing signal. The write driver may be configured to perform a preselection operation on a selected memory cell based on the preselection signal, perform a reset write operation on the selected memory cell based on the reset write signal, and perform a set write operation on the selected memory cell based on the set write signal.

DETAILED DESCRIPTION

Various embodiments of the present teachings are directed to a nonvolatile memory apparatus which can perform a preselection operation during a write operation, perform the write operation on a memory cell which was snapped back, according to write data, and prevent a voltage and/or current from being applied to a memory cell which is not snapped back, and an operating method thereof.

The nonvolatile memory apparatus and the operating method thereof in accordance with the present embodiments can mitigate disturbances which may occur in a memory cell during a write operation of the nonvolatile memory apparatus, thereby the reliability of the nonvolatile memory apparatus is improved.

Figure 1:
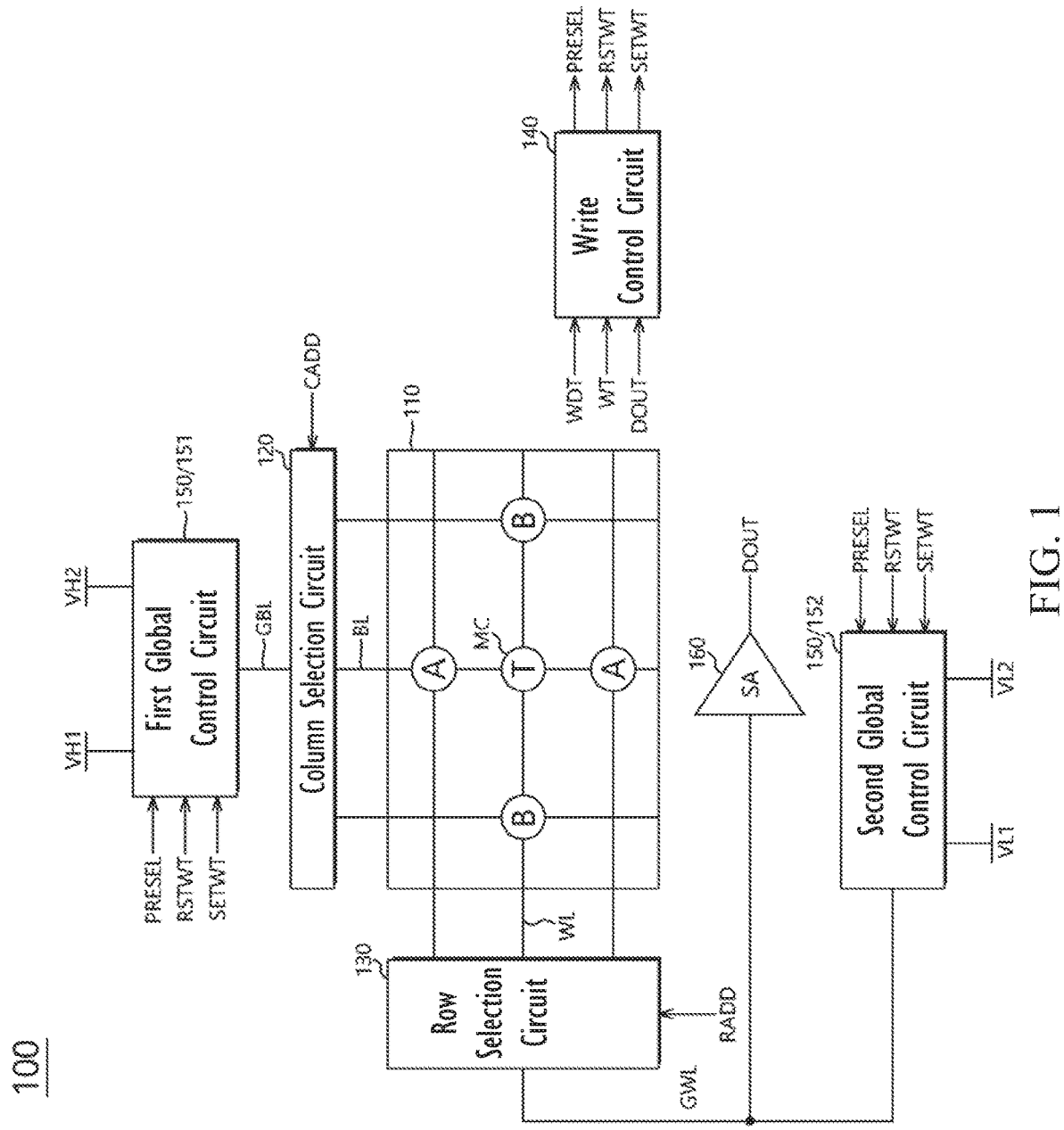
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. In FIG. 1, the nonvolatile memory apparatus 100 may include a memory array 110. The memory array 110 may include a plurality of bit lines BL arranged in a column direction and a plurality of word lines WL arranged in a row direction. A plurality of memory cells MC may be coupled to the respective intersections between the plurality of bit lines BL and the plurality of word lines WL. Each of the memory cells MC may be coupled between a bit line BL and a word line WL which correspond thereto. The memory cell MC may be configured as a variable resistance element, and include a phase change material, for example. The nonvolatile memory apparatus 100 may be a resistive memory apparatus or a phase change memory apparatus. The memory array 110 may be configured as a cross-point array.

The nonvolatile memory apparatus 100 may include a column selection circuit 120 and a row selection circuit 130. The column selection circuit 120 may be coupled between a first global electrode GBL and the plurality of bit lines BL. The column selection circuit 120 may couple a bit line selected among the plurality of bit lines BL to the first global electrode GBL. The column selection circuit 120 may select a specific bit line among the plurality of bit lines BL based on a column address signal CADD, and couple the selected bit line to the first global electrode GBL. The row selection circuit 130 may be coupled between a second global electrode GWL and the plurality of word lines WL. The row selection circuit 130 may couple a word line selected among the plurality of word lines WL to the second global electrode GWL. The row selection circuit 130 may select a specific word line among the plurality of word lines WL based on a row address signal RADD, and couple the selected word line to the second global electrode GWL. As the specific bit line and the specific word line are selected, a specific memory cell may be selected.

The nonvolatile memory apparatus 100 may perform a write operation on the selected memory cell. When the write operation is performed, the selected memory cell may be set in a low or high resistance state. When the memory cell is set in the low resistance state, the memory cell may become a set cell having cell data stored therein. When the memory cell is set in the high resistance state, the memory cell may become a reset cell having reset data stored therein. When the write operation is performed, the nonvolatile memory apparatus 100 may first perform a preselection operation. According to the result of the preselection operation, the nonvolatile memory apparatus 100 may selectively perform a write operation on the selected memory cell. The preselection operation may indicate an operation of snapping back and/or turning on the selected memory cell. The nonvolatile memory apparatus 100 may perform the preselection operation to snap back and/or turn on the selected memory cell regardless of the resistance state of the selected memory cell. Therefore, when the selected memory cell is in the low or high resistance state, the selected memory cell may be snapped back by the preselection operation. When the selected memory cell is a defective cell, the selected memory cell might not be snapped back by the preselection operation. The defective cell may be an open cell having higher resistance than in a typical high resistance state. Because the open cell is generally in an over-reset state, the open cell cannot be set in the low or high resistance state through a write operation. The nonvolatile memory apparatus 100 may prevent a voltage and current from being applied to the defective cell. When the selected memory cell is not snapped back, the nonvolatile memory apparatus 100 may interrupt a voltage and current applied to the selected memory cell. Therefore, the nonvolatile memory apparatus 100 can reduce an unnecessary current consumed for the write operation, and mitigate disturbance of memory cells adjacent to the selected memory cell.

FIG. 1 illustrates a selected memory cell T, and memory cells adjacent to the selected memory cell T may be half-selected memory cells A and B. The half-selected memory cell A may be a memory cell which is coupled to the same bit line as the selected memory cell T, and coupled to a different word line from the selected to memory cell T. The half-selected memory cell B may be a memory cell which is coupled to a different bit line from the selected memory cell T, and coupled to the same word line as the selected memory cell T. When an inhibit voltage is continuously applied to the half-selected memory cells A and B, disturbance may occur to snap back and/or turn on the half-selected memory cells A and B. In particular, when the half-selected memory cells A and B have a lower threshold voltage than the threshold voltage of typical memory cells, the probability that the disturbance will occur may further rise. In the related art, when the selected memory cell T is a defective cell, an operation of determining whether the selected memory cell T is a defective cell is not performed, and a voltage and current for the preselection operation are continuously applied to the selected memory cell T during a write operation of the nonvolatile memory apparatus 100. Because the voltage and current for the preselection operation may have a voltage level corresponding to the inhibit voltage, unnecessary current consumption may continuously occur, and the probability that the disturbance of the half-selected memory cells A and B will occur is inevitably increased. The nonvolatile memory apparatus 100 in accordance with the present embodiment may determine whether the selected memory cell T is a defective cell, and interrupt a voltage and current applied to the selected memory cell T when the selected memory cell T is a defective cell, thereby reducing power consumed for the write operation and mitigating disturbance of the adjacent memory cells.

In FIG. 1, the nonvolatile memory apparatus 100 may include a write circuit 140 and 150 and a sense amplifier (SA) 160. The write circuit 140 and 150 may perform one of a preselection operation, a reset write operation, and a set write operation on a memory cell selected during a write operation of the nonvolatile memory apparatus 100. The write circuit 140 and 150 may apply a preselection voltage to the selected memory cell based on the write signal WT, in order to perform the preselection operation on the selected memory cell. The write signal WT, which is enabled when the nonvolatile memory apparatus 100 performs a write operation, may be generated based on a command signal. The write circuit 140 and 150 may selectively perform the reset write operation and the set write operation, based on whether the selected memory cell was snapped back through the preselection operation. When the selected memory cell was snapped back, the write circuit 140 and 150 may perform the reset write operation and the set write operation based on write data WDT. When the selected memory cell was snapped back and the write data WDT is reset data, the write circuit 140 and 150 may apply a reset write voltage to the selected memory cell, in order to perform the reset write operation on the selected memory cell. When the selected memory cell was snapped back and the write data WDT is set data, the write circuit 140 and 150 may apply a set write voltage to the selected memory cell, in order to perform the set write operation on the selected memory cell. When the selected memory cell is not snapped back, the write circuit 140 and 150 may apply no voltage and current to the selected memory cell. The write circuit 140 and 150 may interrupt a voltage and current applied to the selected memory cell, until the write operation is ended after the preselection operation is completed. The write circuit 140 and 150 may determine whether the selected memory cell has been snapped back, based on a sensing signal DOUT.

The SA 160 may sense whether the selected memory cell was snapped back. The SA 160 may generate the sensing signal DOUT by sensing whether the selected memory cell was snapped back. When the selected memory cell was snapped back, the SA 160 may enable the sensing signal DOUT. When the selected memory cell is not snapped back, the SA 160 may retain the sensing signal DOUT in a disabled state. The SA 160 may be coupled to the second global electrode GWL, and generate the sensing signal DOUT by sensing a change in voltage level of the second global electrode GWL. When the selected memory cell is snapped back, the amount of current flowing through the selected memory cell may rapidly increase. Thus, the voltage level of the first global electrode GBL may fall, and the voltage level of the second global electrode GWL may rise. The SA 160 may generate the sensing signal DOUT by sensing the rise in voltage level of the second global electrode GWL or the amount of current flowing through the second global electrode GWL. In an embodiment, the SA 160 may be coupled to the first global electrode GBL, and generate the sensing signal DOUT by sensing a change in voltage level of the first global electrode GBL. The SA 160 may be modified to generate the sensing signal DOUT by sensing the fall in voltage level of the first global electrode GBL or the amount of current flowing through the first global electrode GBL.

The write circuit 140 and 150 may include a write control circuit 140 and a write driver 150. The write control circuit 140 may generate a control signal for controlling the write driver 150 to perform various operations. The write control circuit 140 may generate a preselection signal PRESEL, a reset write signal RSTWT, and a set write signal SETWT during a write operation of the nonvolatile memory apparatus 100. When the write operation is performed, the write control circuit 140 may first generate the preselection signal PRESEL. The write control circuit 140 may generate the preselection signal PRESEL to perform the preselection operation. The write control circuit 140 may selectively perform the write operation depending on whether the selected memory cell was snapped back through the preselection operation. When the selected memory cell was snapped back, the write control circuit 140 may generate one of the reset write signal RSTWT and the set write signal SETWT. When the selected memory cell is not snapped back, the write control circuit 140 may disable the preselection signal PRESEL, and generate none of the reset write signal RSTWT and the set write signal SETWT.

The write control circuit 140 may generate the preselection signal PRESEL based on the write signal WT. When the selected memory cell was snapped back, the write control circuit 140 may generate one of the reset write signal RSTWT and the set write signal SETWT based on the write data WDT. The operation of determining whether the selected memory cell was snapped back may be performed based on the sensing signal DOUT.

The write control circuit 140 may enable one of the reset write signal RSTWT and the set write signal SETWT based on the sensing signal DOUT and the write data WDT. When the sensing signal DOUT is enabled and the write data WDT is reset data, the write control circuit 140 may enable the reset write signal RSTWT. When the sensing signal DOUT is enabled and the write data WDT is set data, the write control circuit 140 may enable the set write signal SETWT. When the sensing signal DOUT is disabled, the write control circuit 140 may retain both of the reset write signal RSTWT and the set write signal SETWT in a disabled state, regardless of the write data WDT.

The write driver 150 may receive a control signal from the write control circuit 140, and may perform the preselection operation, the reset write operation, and the set write operation on the selected memory cell. The write driver 150 may perform the preselection operation on the selected memory cell based on the preselection signal PRESEL. The write driver 150 may perform the preselection operation on the selected memory cell by applying the preselection voltage and a first current to the selected memory cell based on the preselection signal PRESEL. The write driver 150 may perform the reset write operation on the selected memory cell based on the reset write signal RSTWT. The write driver 150 may perform the reset write operation on the selected memory cell by applying the reset write voltage and a second current to the selected memory cell based on the reset write signal PRTWT. The write driver 150 may perform the set write operation on the selected memory cell based on the set write signal SETWT. The write driver 150 may perform the set write operation on the selected memory cell by applying the set write voltage and a third current to the selected memory cell based on the set write signal SETWT. The preselection voltage may have a voltage level lower than the reset write voltage and higher than the set write voltage. The amount of the third current may be larger than the amount of the first current, and smaller than the amount of the second current.

The write driver 150 may include a first global control circuit 151 and a second global control circuit 152. The first global control circuit 151 may be coupled to the first global electrode GBL, and receive a first high supply voltage VH1 and a second high supply voltage VH2. The first high supply voltage VH1 may have a higher voltage level than the second high supply voltage VH2. The first global control circuit 151 may selectively apply a first high voltage, a second high voltage, and a third high voltage to the first global electrode GBL, based on the preselection signal PRESEL, the reset write signal RSTWT, and the set write signal SETWT. The first global control circuit 151 may apply the first high voltage to the first global electrode GBL based on the preselection signal PRESEL. The first global control circuit 151 may apply the second high voltage to the first global electrode GBL based on the reset write signal RSTWT. The first global control circuit 151 may apply the third high voltage to the first global electrode GBL based on the set write signal SETWT. The first high voltage may have a voltage level higher than the third high voltage and lower than the second high voltage. The first high voltage may be generated by clamping the first high supply voltage VH1, and the second high voltage may have substantially the same voltage level as the first high supply voltage VH1. The third high voltage may have substantially the same voltage level as the second high supply voltage VH2.

The second global control circuit 152 may be coupled to the second global electrode GWL, and receive a first low supply voltage VL1 and a second low supply voltage VL2. The first low supply voltage VL1 may have a voltage level higher than the second low supply voltage VL2 and lower than the second high supply voltage VH2. The second global control circuit 152 may selectively apply a first low voltage, a second low voltage, and a third low voltage to the second global electrode GWL, based on the preselection signal PRESEL, the reset write signal RSTWT, and the set write signal SETWT. The second global control circuit 152 may apply the first low voltage to the second global electrode GWL based on the preselection signal PRESEL. The second global control circuit 152 may apply the second low voltage to the second global electrode GWL based on the reset write signal RSTWT. The second global control circuit 152 may apply the third low voltage to the second global electrode GWL based on the set write signal SETWT. The first low voltage may have a higher voltage level than the second and third low voltages. The second and third low voltages may have substantially the same voltage level. In an embodiment, the second low voltage may have a lower voltage level than the third low voltage. The second global control circuit 152 may control the first to third currents to selectively flow through the second global electrode GWL, based on the preselection signal PRESEL, the reset write signal RSTWT and the set write signal SETWT. The second global control circuit 152 may control the first current to flow through the second global electrode GWL based on the preselection signal PRESEL. The second global control circuit 152 may control the second current to flow through the second global electrode GWL based on the reset write signal RSTWT. The second global control circuit 152 may control the third current to flow through the second global electrode GWL based on the set write signal SETWT. The first current may be a sneak current corresponding to the minimum current which can retain a turn-on state of the selected memory cell, when the selected memory cell is snapped back. The second current may be a reset write current for programming the resistance state of the selected memory cell to the high resistance state. The third current may be a set write current for programming the resistance state of the selected memory cell to the low resistance state.

Figure 2:
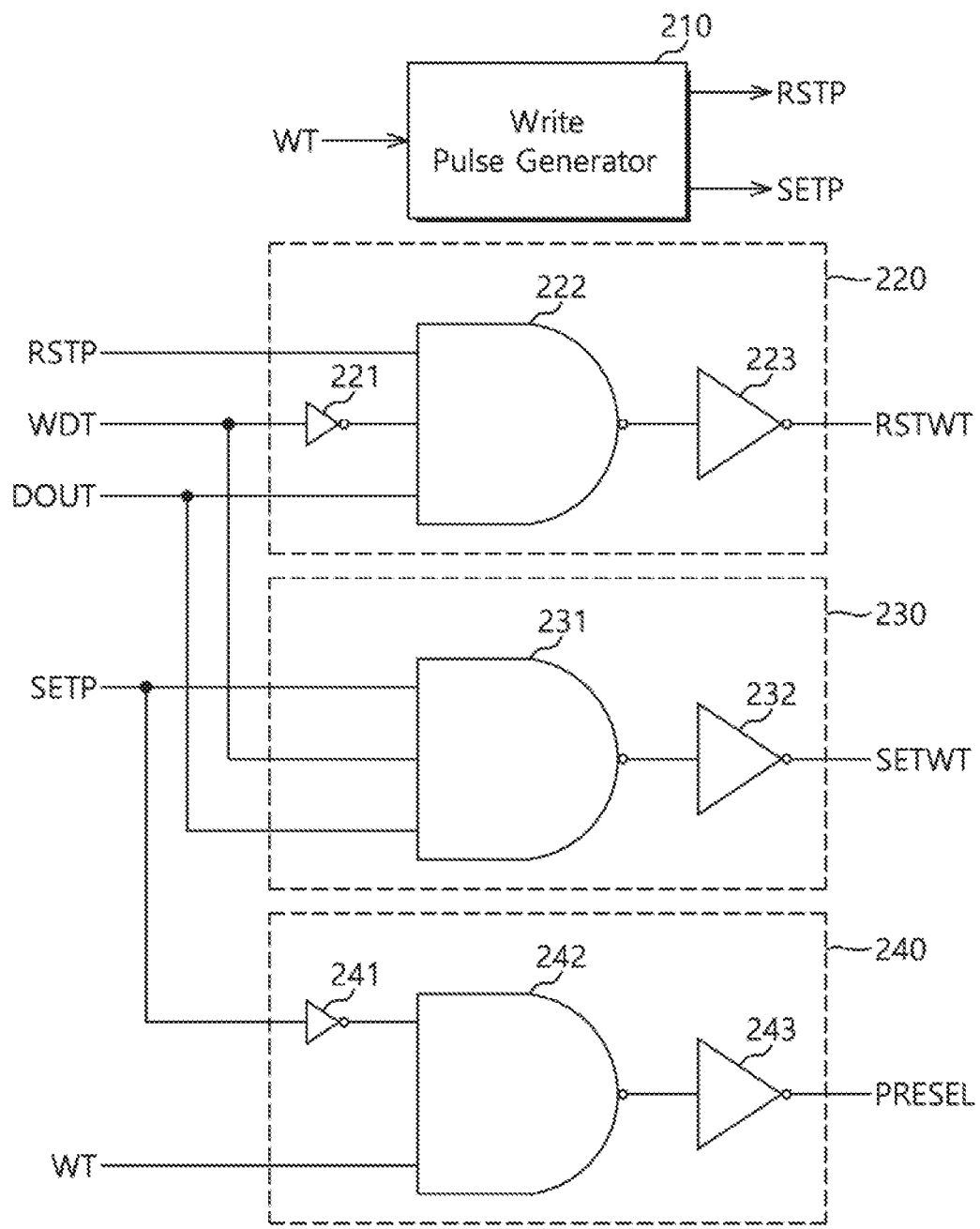
FIG. 2 is a diagram illustrating a configuration of a write control circuit illustrated in FIG. 1.

Referring to FIG. 2, the write control circuit 140 may include a write pulse generator 210, a reset write signal generator 220, a set write signal generator 230, and a preselection signal generator 240. The write pulse generator 210 may receive the write signal WT. The write pulse generator 210 may generate a reset pulse signal RSTP and a set pulse signal SETP based on the write signal WT. The reset pulse signal RSTP may have a pulse width to define the time during which the reset write operation is performed, and the set pulse signal SETP may have a pulse width to define the time during which the set write operation is performed. The set pulse signal SETP may have a longer pulse width than the reset pulse signal RSTP. The write pulse generator 210 may generate the reset pulse signal RSTP and the set pulse signal SETP, when the time during which the preselection operation is performed elapses after the write signal WT is enabled. The time during which the preselection operation is performed may include at least the time required until the preselection voltage and the first current applied to the selected memory cell to snap back the selected memory cell, and the SA 160 generates the sensing signal DOUT.

The reset write signal generator 220 may receive the reset pulse signal RSTP, the write data WDT, and the sensing signal DOUT, and may generate the reset write signal RSTWT. When the write data WDT is reset data, the write data WDT may have a logic low level. When the write data WDT is set data, the write data WDT may have a logic high level. When the write data WDT is at a logic low level and the sensing signal DOUT is enabled to a logic high level, the reset write signal generator 220 may output the reset pulse signal RSTP as the reset write signal RSTWT, and enable the reset write signal RSTWT. The set write signal generator 230 may receive the set pulse signal SETP, the write data WDT and the sensing signal DOUT, and generate the set write signal SETWT. When the write data WDT is at a logic high level and the sensing signal DOUT is enabled to a logic high level, the set write signal generator 230 may output the set pulse signal SETP as the set write signal SETWT, and enable the set write signal SETWT. The preselection signal generator 240 may receive the write signal WT and the set pulse signal SETP, and generate the preselection signal PRESEL. The preselection signal generator 240 may enable the preselection signal PRESEL based on the write signal WT. The preselection signal generator 240 may disable the preselection signal PRESEL when the set pulse signal SETP is enabled. Because the set pulse signal SETP is enabled when the time during which the preselection operation is performed elapses after the write signal WT is enabled, the set pulse signal SETP may be used to decide the point of time that the preselection signal PRESEL is disabled. In an embodiment, the preselection signal generator 240 may disable the preselection signal PRESEL based on the reset pulse signal RSTP, instead of the set pulse signal SETP. The preselection signal generator 240 may be modified to generate the preselection signal PRESEL, based on one or more of the write signal WT, the set pulse signal SETP and the reset pulse signal RSTP.

The reset write signal generator 220 may include a first inverter 221, a first NAND gate 222, and a second inverter 223. The first inverter 221 may invert the write data WDT and output the inverted signal. The first NAND gate 222 may receive the reset pulse signal RSTP, the output of the first inverter 221, and the sensing signal. The second inverter 223 may invert an output of the first NAND gate 222 and output the inverted signal as the reset write signal RSTWT. The set write signal generator 230 may include a second NAND gate 231 and a third inverter 232. The second NAND gate 231 may receive the set write pulse SETP, the write data WDT, and the sensing signal DOUT. The third inverter 232 may invert an output of the second NAND gate 231 and output the inverted signal as the set write signal SETWT. The preselection signal generator 240 may include a fourth inverter 241, a third NAND gate 242, and a fifth inverter 243. The fourth inverter 241 may invert the set write pulse SETP. The third NAND gate 242 may receive an output of the fourth inverter 241 and the write signal WT. The fifth inverter 243 may invert an output of the third NAND gate 242 and output the inverted signal as the preselection signal PRESEL.

Figure 3:
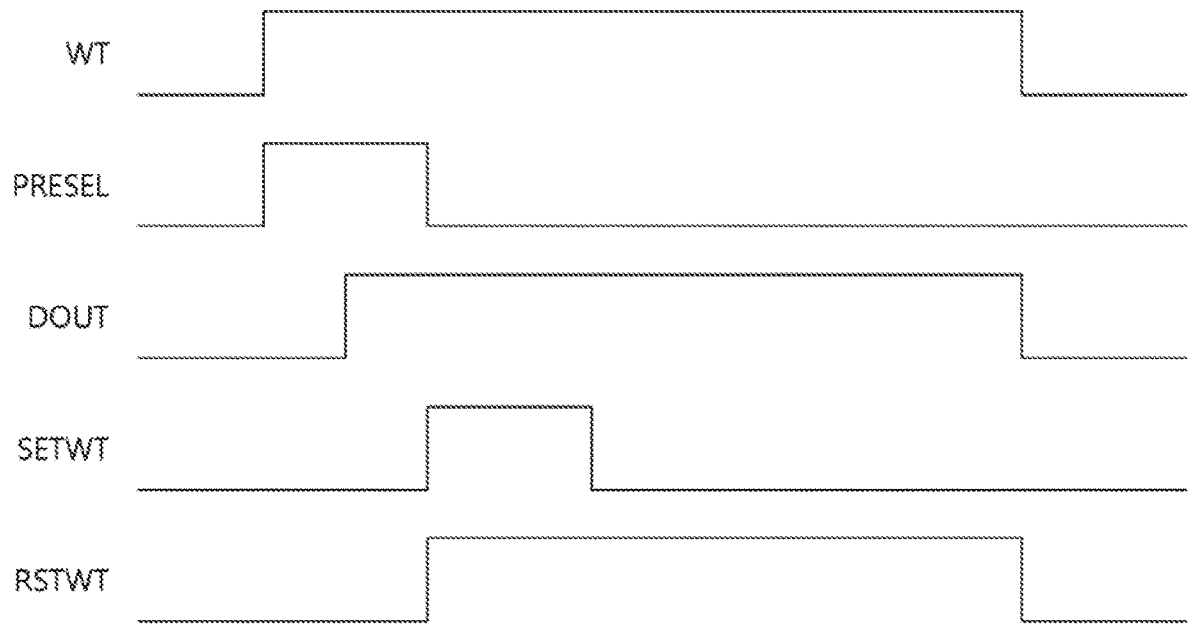
FIG. 3 is a timing diagram illustrating an operation of the write control circuit illustrated in FIG. 2.

FIG. 3 is a timing diagram illustrating an operation of the write control circuit 140 illustrated in FIG. 2. When a write operation of the nonvolatile memory apparatus 100 is performed, the write signal WT may be enabled. When the write signal WT is enabled, the preselection signal generator 240 may enable the preselection signal PRESEL. When the preselection operation is performed based on the preselection signal PRESEL such that the selected memory cell is snapped back, the sensing signal DOUT may be enabled. The write pulse generator 210 may enable the reset pulse signal RSTP and the set pulse signal SETP after the time during which the preselection operation is performed elapses. When the set pulse signal SETP is enabled, the preselection signal generator 240 may disable the preselection signal PRESEL. When the write data WDT is reset data, the reset write signal generator 220 may output the reset pulse signal RSTP as the reset write signal RSTWT. When the write data WDT is set data, the set write signal generator 230 may output the set pulse signal SETP as the set write signal SETWT.

Figure 4:
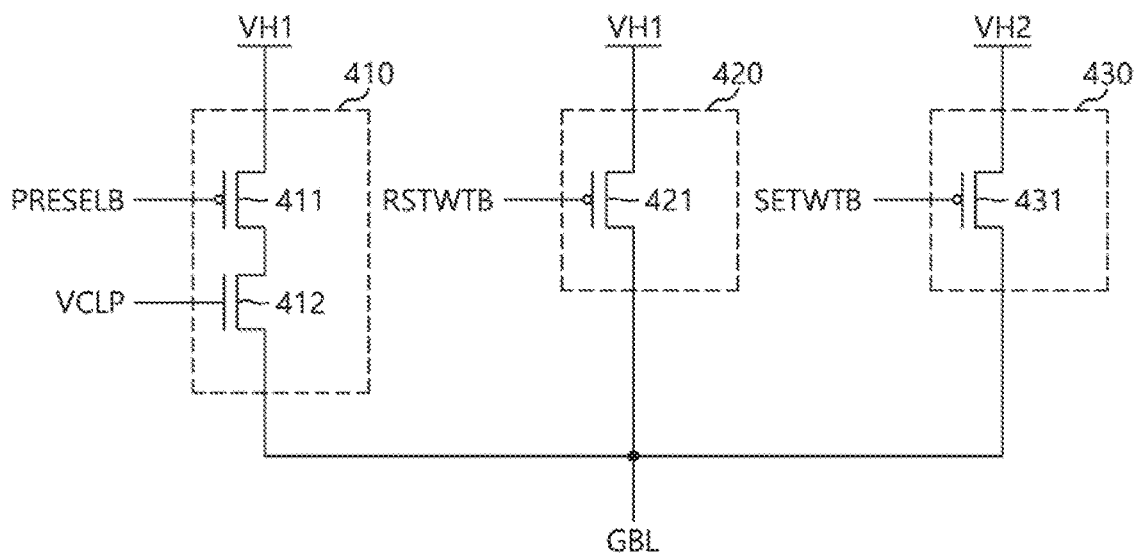
FIG. 4 is a diagram illustrating a configuration of a first global control circuit illustrated in FIG. 1.

FIG. 4 is a diagram illustrating the configuration of the first global control circuit 151 illustrated in FIG. 1. In FIG. 4, the first global control circuit 151 may include a first high voltage generator 410, a second high voltage generator 420, and a third high voltage generator 430. The first high voltage generator 410 may receive the first high supply voltage VH1 and the preselection signal PRESEL. The first high voltage generator 410 may generate the first high voltage based on the preselection signal PRESEL, and provide the first high voltage to the first global electrode GBL. The first high voltage generator 410 may further receive a clamp signal VCLP. The clamp signal VCLP may be a bias voltage having a constant voltage level. The first high voltage generator 410 may drop the voltage level of the first high supply voltage VH1 based on the clamp signal VCLP, and provide the dropped voltage as the first high voltage. The first high voltage generator 410 may include a first transistor 411 and a second transistor 412. The first transistor 411 may be a P-channel MOS transistor, and the second transistor 412 may be an N-channel MOS transistor. The first transistor 411 may have a gate configured to receive a complementary signal PRESELB of the preselection signal and a source configured to receive the first high supply voltage VH1. The second transistor 412 may have a gate configured to receive the clamp signal VCLP, a drain coupled to a drain of the first transistor 411, and a source coupled to the first global electrode GBL. When the preselection signal PRESEL is enabled, the first transistor 411 may provide the first high supply voltage VH1 to the second transistor 412, and the second transistor 412 may generate the first high voltage by dropping the voltage provided from the first transistor 411 by the threshold voltage of the second transistor 412, and provide the first high voltage to the first global electrode GBL.

The second high voltage generator 420 may receive the first high supply voltage VH1 and the reset write signal RSTWT. The second high voltage generator 420 may generate the second high voltage from the first high supply voltage VH1 based on the reset write signal RSTWT, and provide the second high voltage to the first global electrode GBL. The second high voltage generator 420 may include a third transistor 421. The third transistor 421 may be a P-channel MOS transistor. The third transistor 421 may have a gate configured to receive a complementary signal RSTWTB of the reset write signal, a source configured to receive the first high supply voltage VH1, and a drain coupled to the first global electrode GBL. When the reset write signal RSTWT is enabled, the third transistor 421 may provide the first high supply voltage VH1 as the second high voltage to the first global electrode GBL.

The third high voltage generator 430 may receive the second high supply voltage VH2 and the set write signal SETWT. The third high voltage generator 430 may generate the third high voltage from the second high supply voltage VH2 based on the set write signal SETWT, and provide the third high voltage to the first global electrode GBL. The third high voltage generator 430 may include a fourth transistor 431. The fourth transistor 431 may be a P-channel MOS transistor. The fourth transistor 431 may have a gate configured to receive a complementary signal SETWTB of the set write signal, a source configured to receive the second high supply voltage VH2, and a drain coupled to the first global electrode GBL. When the reset write signal RSTWT is enabled, the fourth transistor 431 may provide the second high supply voltage VH2 as the third high voltage to the first global electrode GBL.

Figure 5:
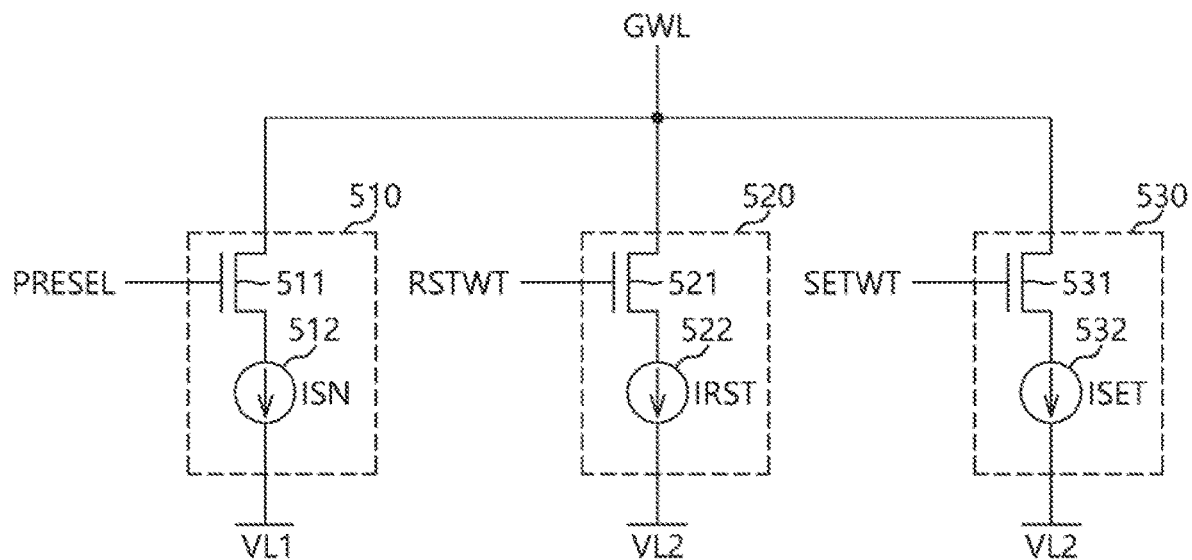
FIG. 5 is a diagram illustrating a configuration of a second global control circuit illustrated in FIG. 1.

FIG. 5 is a diagram illustrating the configuration of the second global control circuit 152 illustrated in FIG. 1. In FIG. 5, the second global control circuit 152 may include a first low voltage generator 510, a second low voltage generator 520, and a third low voltage generator 530. The first low voltage generator 510 may receive the preselection signal PRESEL and the first low supply voltage VL1. The first low voltage generator 510 may provide the first low supply voltage VL1 to the second global electrode GWL based on the preselection signal PRESEL, and control the first current to flow through the second global electrode GWL. The first low voltage generator 510 may include a fifth transistor 511 and a first current source 512. The fifth transistor 511 may be an N-channel MOS transistor. The fifth transistor 511 may have a gate configured to receive the preselection signal PRESEL and a drain coupled to the second global electrode GWL. The first current source 512 may be a constant current source configured to supply the first current. One terminal of the first current source 512 may be coupled to a source of the fifth transistor 511, and the other terminal of the first current source 512 may be configured to receive the first low supply voltage VL1. When the preselection signal PRESEL is enabled, the fifth transistor 511 may couple the first current source 512 to the second global electrode GWL, provide the first low supply voltage VL1 as the first low voltage to the second global electrode GWL, and control the first current to flow through the second global electrode GWL.

The second low voltage generator 520 may provide the second low voltage to the second global electrode GWL based on the reset write signal RSTWT, and control the second current to flow through the second global electrode GWL. The second low voltage generator 520 may include a sixth transistor 521 and a second current source 522. The sixth transistor 521 may be an N-channel MOS transistor. The sixth transistor 521 may have a gate configured to receive the reset write signal RSTWT and a drain coupled to the second global electrode GWL. The second current source 522 may be a constant current source configured to supply the second current. One terminal of the second current source 522 may be coupled to a source of the sixth transistor 521, and the other terminal of the second current source 522 may be configured to receive the second low supply voltage VL2. When the reset write signal RSTWT is enabled, the sixth transistor 521 may couple the second current source 522 to the second global electrode GWL, provide the second low supply voltage VL2 as the second low voltage to the second global electrode GWL, and control the second current to flow through the second global electrode GWL.

The third low voltage generator 530 may provide the third low voltage to the second global electrode GWL based on the set write signal SETWT, and control the third current to flow through the second global electrode GWL. The third low voltage generator 530 may include a seventh transistor 531 and a third current source 532. The seventh transistor 531 may be an N-channel MOS transistor. The seventh transistor 531 may have a gate configured to receive the set write signal SETWT and a drain coupled to the second global electrode GWL. The third current source 532 may be a constant current source configured to supply the third current. One terminal of the third current source 532 may be coupled to a source of the seventh transistor 531, and the other terminal of the third current source 532 may be configured to receive the second low supply voltage VL2. When the set write signal SETWT is enabled, the seventh transistor 531 may couple the third current source 532 to the second global electrode GWL, provide the second low supply voltage VL2 as the third low voltage to the second global electrode GWL, and control the third current to flow through the second global electrode GWL.

Figure 6:
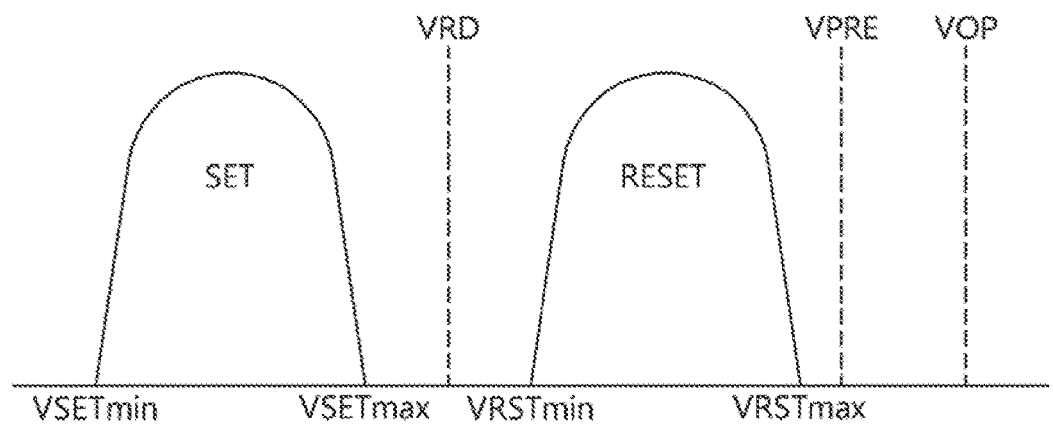
FIG. 6 is a graph illustrating threshold voltage distributions depending on the resistance states of memory cells.

FIG. 6 is a graph illustrating threshold voltage distributions of memory cells. In FIG. 6, the horizontal axis may indicate a voltage level. A memory cell programmed in the low resistance state may be a set cell SET, and have a relatively low threshold voltage. A memory cell programmed in the high resistance state may be a reset cell RESET, and have a relatively high threshold voltage. The set cell SET may have a threshold voltage between a set distribution minimum voltage VSETmin and a set distribution maximum voltage VSETmax. The reset cell RESET may have a threshold voltage between a reset distribution minimum voltage VRSTmin and a reset distribution maximum voltage VRSTmax. The threshold voltage VOP of an over-reset and/or open cell may have a higher voltage level than the reset distribution maximum voltage VRSTmax. The read voltage VRD may have a voltage level between the set distribution maximum voltage VSETmax and the reset distribution minimum voltage VRSTmin. The read voltage VRD may correspond to a demarcation voltage which can distinguish between the set cell SET and the reset cell RESET. The read voltage VRD may be used for a read operation of the nonvolatile memory apparatus, and used for a write operation of the nonvolatile memory apparatus which performs a pre-read operation. The pre-read operation may indicate an operation of determining the resistance state of a memory cell before writing one of set data and reset data to the memory cell. The preselection voltage VPRE may have a voltage level equal to or higher than the reset distribution maximum voltage VRSTmax, in order to snap back both of a memory cell in the low resistance state and a memory cell in the high resistance state.

Figure 7:
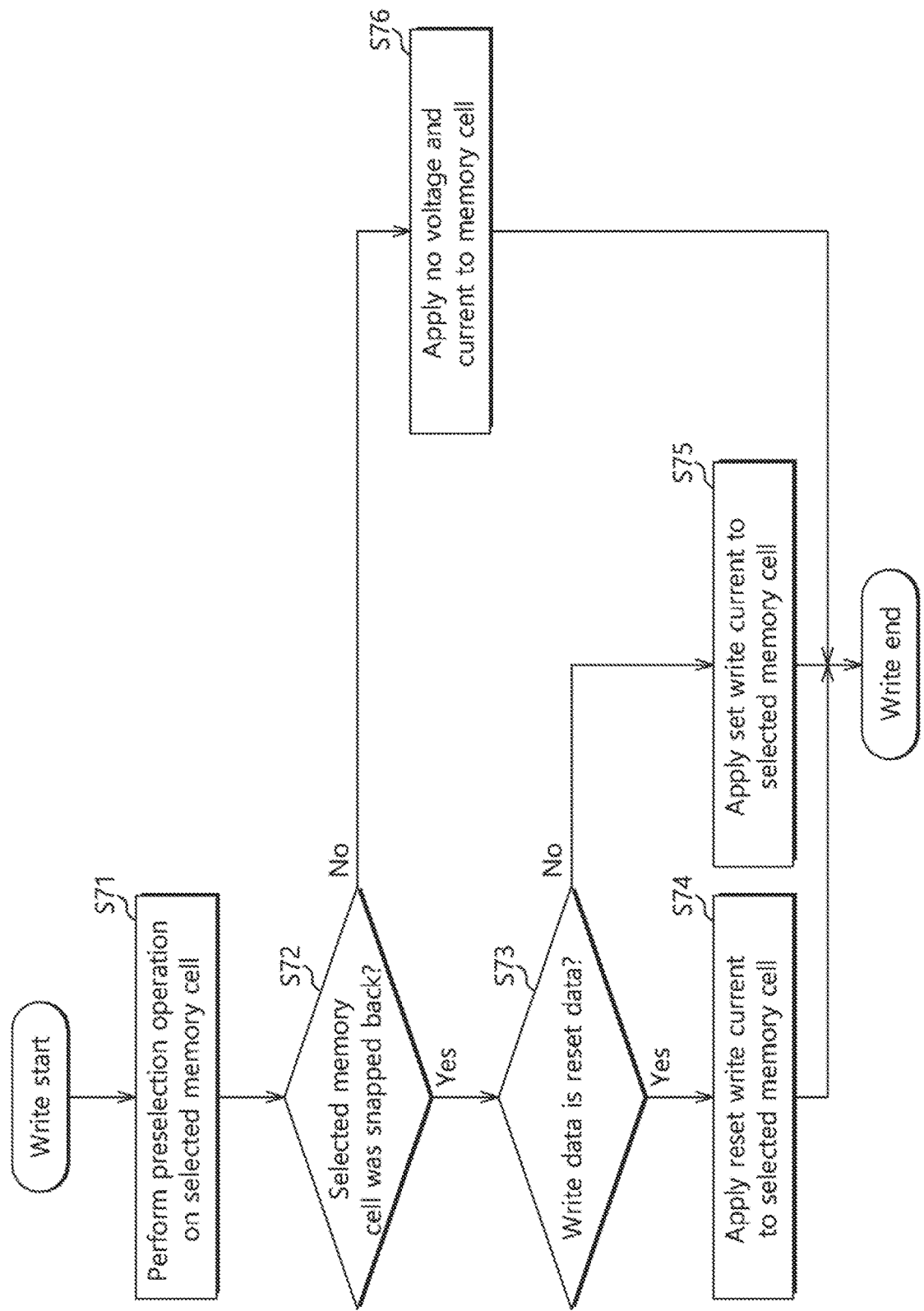
FIG. 7 is a flowchart illustrating a method of operation of a nonvolatile memory apparatus in accordance with an embodiment.
Figure 8A:
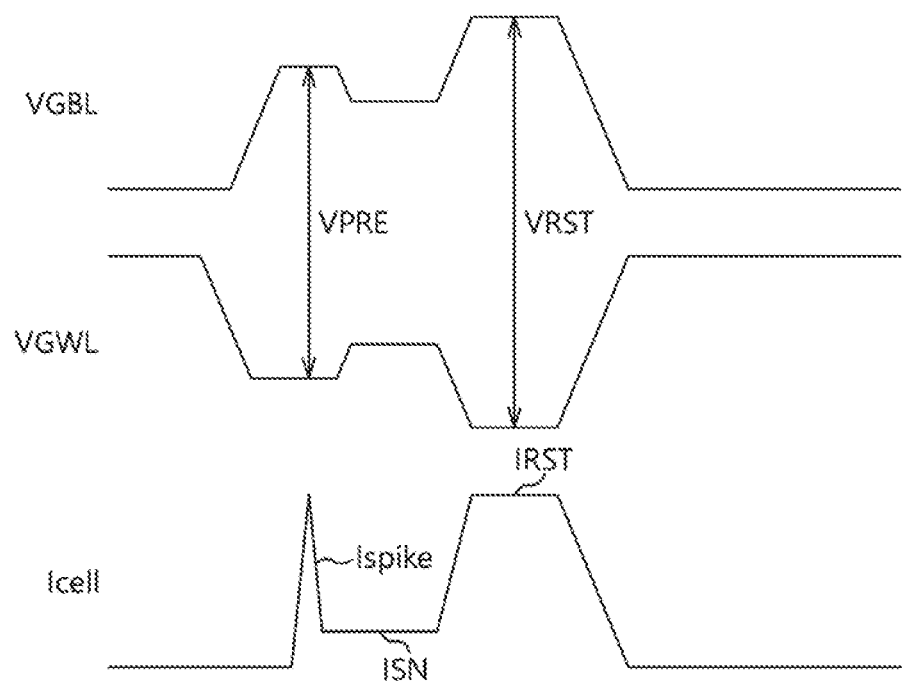
FIGS. 8A, 8B, and 8C are timing diagrams illustrating operations of the nonvolatile memory apparatus in accordance with the embodiment.
Figure 8B:
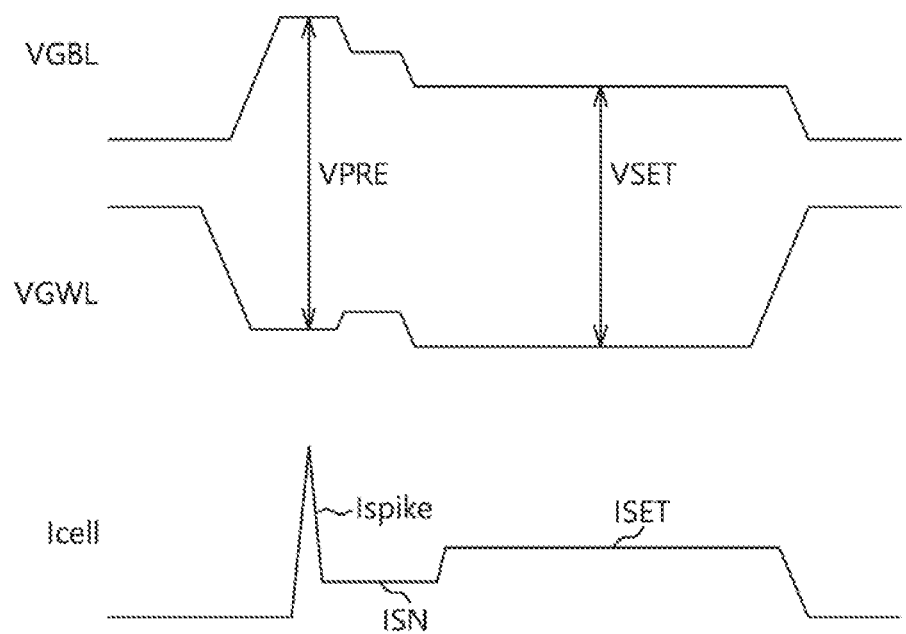
Figure 8C:
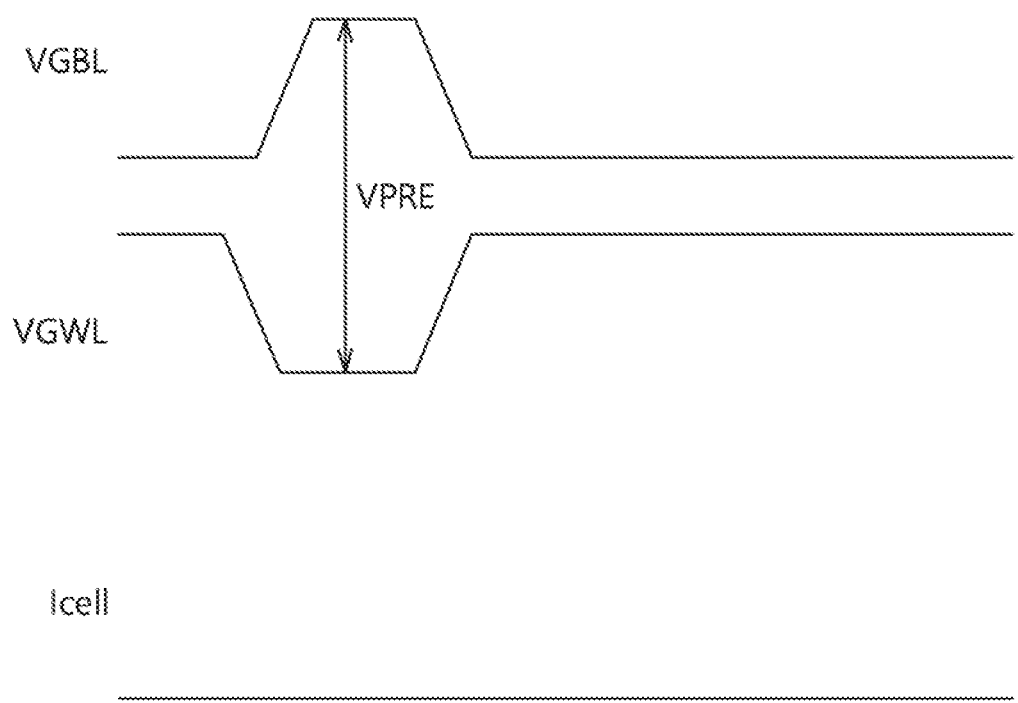

FIG. 7 is a flowchart illustrating a method of operation of the nonvolatile memory apparatus in accordance with the present embodiment, and FIGS. 8A, 8B, and 8C are timing diagrams illustrating operations of the nonvolatile memory apparatus in accordance with the embodiment. Referring to FIGS. 1 to 8C, the operations of the nonvolatile memory apparatus 100 in accordance with the present embodiment are described as follows. When a write operation of the nonvolatile memory apparatus 100 is performed, the nonvolatile memory apparatus 100 may select a specific memory cell based on a column address signal and a row address signal. When the write operation is started, the write signal WT may be enabled, and the write control circuit 140 may enable the preselection signal PRESEL. At S71, the nonvolatile memory apparatus 100 may perform the preselection operation on a selected memory cell. The write circuit 140 may perform the preselection operation on the selected memory cell based on the preselection signal PRESEL. At S72, the nonvolatile memory apparatus 100 may determine whether the selected memory cell was snapped back. When the selected memory cell was snapped back through the preselection operation, the SA 160 may enable the sensing signal DOUT, and the process may proceed from S72 to S73. When the selected memory cell is not snapped back, the SA 160 may retain the sensing signal DOUT in a disabled state, and the process may proceed from S72 to S76. The write circuit 140 and 150 may selectively perform the reset write operation and the set write operation on the selected memory cell based on the write data WDT and whether the selected memory cell was snapped back. When the snap back of the selected memory cell occurs, one of the reset write operation and the set write operation may be performed on the selected memory cell. At S73, the nonvolatile memory apparatus 100 may determine whether the write data WDT is reset data or set data. When the write data WDT is reset data, the process may proceed from S73 to S74. When the write data WDT is set data, the process may proceed from S73 to S75. At S74, the write driver 150 may apply the reset write current to the selected memory cell to write the reset data to the selected memory cell. The write control circuit 140 may output the reset write pulse RSTP as the reset write signal RSTWT based on the sensing signal DOUT and the write data WDT, and the write driver 150 may apply the reset write voltage to the selected memory cell based on the reset write signal RSTWT, and control the second current to flow through the selected memory cell. The selected memory cell may be programmed to the high resistance state to store the reset data, and the write operation may be ended. At S75, the write driver 150 may apply the set write current to the selected memory cell to write the set data to the selected memory cell. The write control circuit 140 may output the set write pulse SETP as the set write signal SETWT based on the sensing signal DOUT and the write data WDT, and the write driver 150 may apply the set write voltage to the selected memory cell based on the set write signal SETWT, and control the third current to flow through the selected memory cell. The selected memory cell may be programmed to the low resistance state to store the set data, and the write operation may be ended.

When the selected memory cell is not snapped back at S72, no voltage and current may be applied to the selected memory cell at step S76. When the selected memory cell is not snapped back, the SA 160 may retain the sensing signal DOUT in a disabled state. When the selected memory cell is not snapped back, the write circuit 140 and 150 might not perform the reset write operation and the set write operation on the selected memory cell regardless of the write data WDT, and interrupt the preselection voltage applied to the selected memory cell. The write control circuit 140 might not enable both of the reset write signal RSTWT and the set write signal SETWT based on the sensing signal DOUT. Therefore, the write driver 150 may apply no voltage and current to the selected memory cell, and the write operation may be ended.

In FIGS. 8A, 8B, and 8C, "VGBL" represents a voltage level of the first global electrode GBL, "VGWL" represent a voltage level of the second global electrode GWL, and "Icell" represents a current flowing through the selected memory cell. As illustrated in FIGS. 8A, 8B, and 8C, when the write operation of the nonvolatile memory apparatus is performed, the second global control circuit 152 may apply the first low voltage to the second global electrode GWL based on the preselection signal PRESEL, and the voltage level VGWL of the second global electrode GWL may fall to the voltage level of the first low voltage. Furthermore, the second global control circuit 152 may control the first current ISN to flow through the second global electrode GWL. The first global control circuit 151 may apply the first high voltage based on the preselection signal PRESEL, and the voltage level VGBL of the first global electrode GBL may rise to the voltage level of the first high voltage. When the voltage level across the selected memory cell reaches a voltage level corresponding to the preselection voltage VPRE, the selected memory cell may be snapped back. As illustrated in FIGS. 8A and 8B, when the selected memory cell is not an over-reset and/or open cell, the selected memory cell may be snapped back, and a spike current Ispike may flow through the memory cell. When the spike current Ispike flows, the voltage level VGBL of the first global electrode GBL may fall, and the voltage level VGWL of the second global electrode GWL may rise. The SA 160 may sense a change in voltage level VGWL of the second global electrode GWL, and enable the sensing signal DOUT.

Referring to FIG. 8A, when the write data WDT is reset data, the write control circuit 140 may enable the reset write signal RSTWT. The first global control circuit 151 may apply the second high voltage to the first global electrode GBL, and the voltage level VGBL of the first global electrode GBL may rise to the second high voltage. The second global control circuit 152 may apply the second low voltage to the second global electrode GWL, and control the second current IRST to flow through the second global electrode GWL. When the voltage level VGWL of the second global electrode GWL falls to the second low voltage, the voltage level across the selected memory cell may reach the reset write voltage VRST, and the selected memory cell may be programmed into the high resistance state while the second current IRST flows through the selected memory cell. When the reset write signal RSTWT is disabled, the voltage level VGBL of the first global electrode GBL may fall, and the voltage level VGWL of the second global electrode GWL may rise. When the write signal WT is disabled, the write operation may be ended.

Referring to FIG. 8B, when the write data WDTE is set data, the write control circuit 140 may enable the set write signal SETWT. The first global control circuit 151 may apply the third high voltage to the first global electrode GBL, and the voltage level VGBL of the first global electrode GBL may fall to the third high voltage. The second global control circuit 152 may apply the third low voltage to the second global electrode GWL, and control the third current ISET to flow through the second global electrode GWL. When the voltage level VGWL of the second global electrode GWL falls to the third low voltage, the voltage level across the selected memory cell may reach the set write voltage VSET, and the selected memory cell may be programmed into the low resistance state while the third current ISET flows through the selected memory cell. When the set write signal SETWT is disabled, the voltage level VGBL of the first global electrode GBL may fall, and the voltage level VGWL of the second global electrode GWL may rise. When the write signal WT is disabled, the write operation may be ended.

Referring to FIG. 8C, when the selected memory cell is an over-reset and/or open cell, the selected memory cell might not be snapped back. Therefore, the spike current Ispike might not flow through the selected memory cell, and the voltage levels of the first and second global electrodes GBL and GWL might not be changed, either. The SA 160 may retain the sensing signal DOUT in a disabled state, and the write control circuit 140 might not enable both of the reset write signal RSTWT and the set write signal SETWT regardless of the write data WDT. When the preselection signal PRESEL is disabled, the voltage level VGBL of the first global electrode GBL may fall, and the voltage level VGWL of the second global electrode GWL may rise. Because the write driver 150 applies no voltage and current to the first and second global electrodes GBL and GWL, the write operation may be ended when the write signal WT is disabled.

Figure 9:
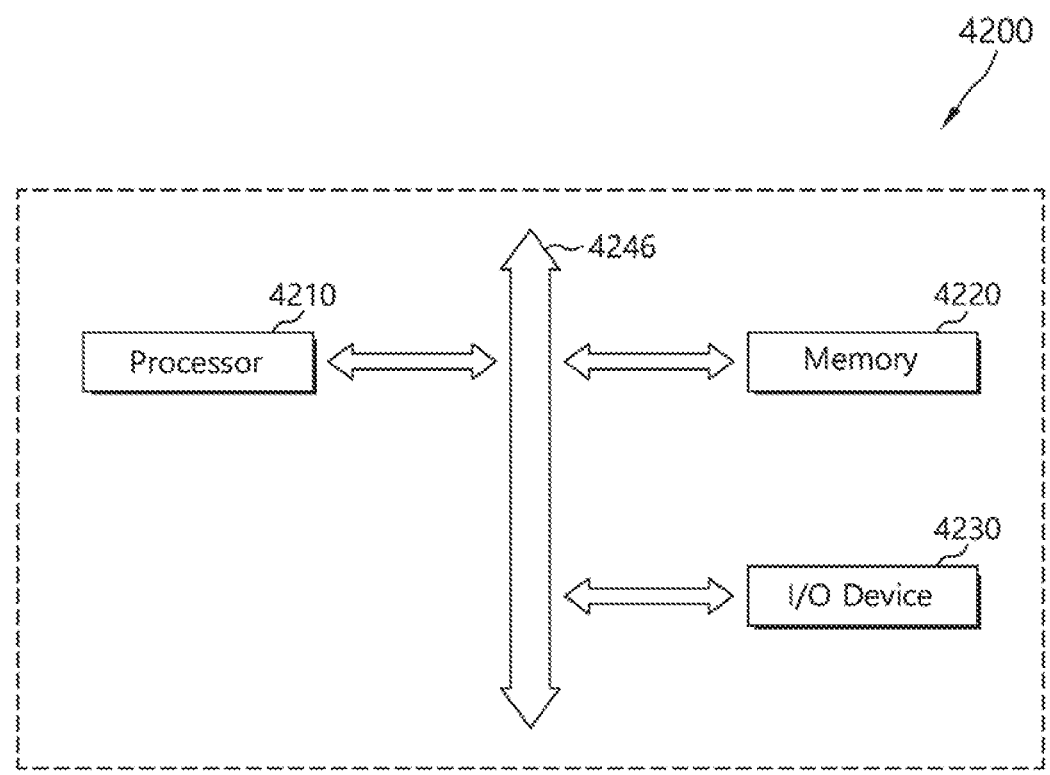
FIG. 9 is a block diagram illustrating an electronic device including a semiconductor memory apparatus in accordance with an embodiment.

FIG. 9 is a block diagram illustrating an electronic device including a semiconductor memory apparatus in accordance with an embodiment. Referring to FIG. 9, the electronic device 4200 may include a processor 4210, a memory 4220, and an input/output (I/O) device 4230. The processor 4210, the memory 4220, and the I/O device 4230 may be coupled through a bus 4246.

The memory 4220 may receive a control signal from the processor 4210. The memory 4220 may store codes and data for an operation of the processor 4210. The memory 4220 may be used to store data accessed through the bus 4246. The memory 4220 may include the above-described nonvolatile memory apparatus 100 in accordance with the present embodiment. For specific implementations and modifications of the present embodiment, additional circuits and control signals may be provided.

The electronic device 4200 may constitute various electronic control devices requiring the memory 4220. For example, the electronic device 4200 may be applied to a computer system, a wireless communication device, or any device which can transmit/receive information in a wireless environment. Example of the wireless communication device may include a PDA, a laptop computer, a portable computer, a web tablet, a wireless phone, a mobile phone, a digital music player, an MP3 player, a navigation system, an SSD (Solid State Disk), and a household appliance.

Figure 10:
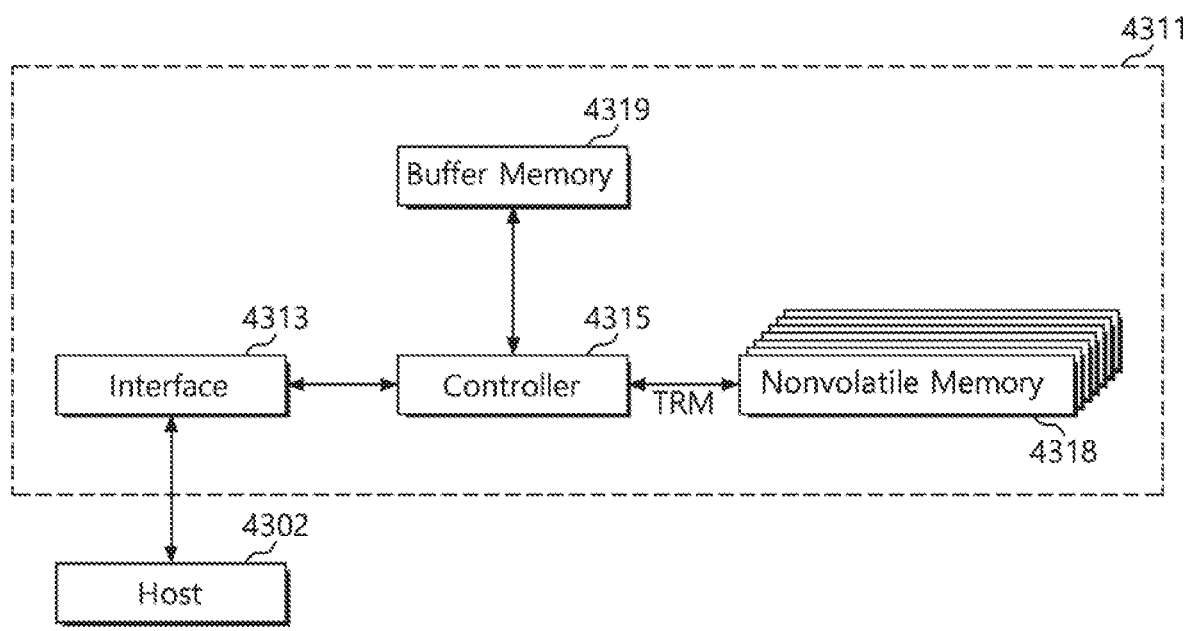
FIG. 10 is a block diagram illustrating a data storage device including a semiconductor memory apparatus in accordance with an embodiment.

FIG. 10 is a block diagram illustrating a data storage device including a semiconductor memory apparatus in accordance with an embodiment. Referring to FIG. 10, a data storage device such as an SSD 4311 may be provided. The SSD 4311 may include an interface 4313, a controller 4315, a nonvolatile memory 4318, and a buffer memory 4319.

The SSD 4311 serves to store information using a semiconductor device. The SSD 4311 has a higher speed, and a smaller mechanical delay or lower failure rate, and a smaller amount of heat or noise than a hard disk drive (HDD). Furthermore, the SSD 4311 can be further reduced in size and weight than the HDD. The SSD 4311 may be widely used in a notebook PC, a netbook, a desktop PC, an MP3 player, or a portable storage device.

The controller 4314 may be formed adjacent to the interface 4313, and electrically coupled to the interface 4313. The controller 4315 may be a microprocessor including a memory controller and a buffer controller. The nonvolatile memory 4318 may be formed adjacent to the controller 4315, and electrically coupled to the controller 4315 via a connection terminal TRM. The SSD 4311 may have a data storage capacity corresponding to the nonvolatile memory 4318. The buffer memory 4319 may be formed adjacent to the controller 4315 and electrically coupled to the controller 4315.

The interface 4313 may be coupled to the host 4302, and serve to transmit and receive electrical signals such as data. For example, the interface 4313 may use standards such as SATA, IDE, SCSI, and/or combinations thereof. The nonvolatile memory 4318 may be coupled to the interface 4313 via the controller 4315.

The nonvolatile memory 4318 may serve to store data received through the interface 4313. The nonvolatile memory 4318 may include the above-described nonvolatile memory apparatus 100 in accordance with the present embodiment. Although power supplied to the SSD 4311 is removed, the data stored in the nonvolatile memory 4318 may be retained.

The buffer memory 4319 may include a volatile memory or nonvolatile memory. The volatile memory may be a DRAM and/or SRAM. The nonvolatile memory may include the above-described nonvolatile memory apparatus 100 in accordance with the present embodiment.

The interface 4313 may have a higher data processing speed than the operation speed of the nonvolatile memory 4318. The buffer memory 4319 may serve to temporarily store data. The data received through the interface 4313 may be temporarily stored in the buffer memory 4319 through the controller 4315, and then permanently stored in the nonvolatile memory 4318 according to the data recording speed of the nonvolatile memory 4318.

Furthermore, data which are frequently used among the data stored in the nonvolatile memory 4318 may be read in advance, and temporarily stored in the buffer memory 4319. That is, the buffer memory 4319 may serve to increase the effective operation speed of the SSD 4311 and reduce an error occurrence rate.

While various embodiments have been described above, it will be understood to those skilled in the art that the embodiments described are examples only. Accordingly, the nonvolatile memory apparatus and the operating method thereof, which have been described herein, should not be limited based on the described embodiments.

What is claimed is:

1. A nonvolatile memory apparatus comprising:
    a sense amplifier configured to sense whether a selected memory cell was snapped back; and
    a write circuit configured to:
        apply a preselection voltage to the selected memory cell based on a write signal;
        apply one of a reset write voltage and a set write voltage to the selected memory cell based on write data when the selected memory cell was snapped back; and
        interrupt a voltage and current applied to the selected memory cell when the selected memory cell is not snapped back.

2. The nonvolatile memory apparatus according to claim 1, wherein the preselection voltage is lower than the reset write voltage and higher than the set write voltage.

3. The nonvolatile memory apparatus according to claim 1, wherein the write circuit comprises:
    a write control circuit configured to:
        generate a preselection signal based on the write signal;
        generate one of a reset write signal and a set write signal based on the write data when the selected memory cell was snapped back; and
        disable the preselection signal and prevent the generation of the reset write signal and the set write signal when the selected memory cell is not snapped back; and
    a write driver configured to:
        apply the preselection voltage to the selected memory cell based on the preselection signal;
        apply the reset write voltage to the selected memory cell based on the reset write signal; and
        apply the set write voltage to the selected memory cell based on the set write signal.

4. The nonvolatile memory apparatus according to claim 3, wherein the write control circuit is configured to:
    generate the preselection signal based on the write signal,
    generate the reset write signal and the set write signal based on the write data and a sensing signal outputted from the sense amplifier, and
    not generate the reset write signal and not generate the set write signal when the sensing signal is disabled.

5. The nonvolatile memory apparatus according to claim 3, wherein the write control circuit comprises:
    a write pulse generator configured to generate a reset pulse signal and a set pulse signal based on the write signal;
    a reset write signal generator configured to generate the reset write signal based on the write data, the reset pulse signal, and a sensing signal outputted from the sense amplifier;
    a set write signal generator configured to generate the set write signal based on the write data, the set pulse signal, and the sensing signal; and
    a preselection signal generator configured to generate the preselection signal based on at least one of the write signal, the reset pulse signal, and the set pulse signal.

6. The nonvolatile memory apparatus according to claim 3, wherein the write driver comprises:
    a first global control circuit configured to apply one of a first high voltage, a second high voltage, and a third high voltage to a first global electrode coupled to the selected memory cell based on the preselection signal, the reset write signal, and the set write signal; and
    a second global control circuit configured to apply one of a first low voltage, a second low voltage, and a third low voltage to a second global electrode coupled to the selected memory cell based on the preselection signal, the reset write signal, and the set write signal, and configured to control one of a first current, a second current, and a third current to flow through the second global electrode.

7. The nonvolatile memory apparatus according to claim 6, wherein the first high voltage is lower than the second high voltage and higher than the third high voltage.

8. The nonvolatile memory apparatus according to claim 6, wherein the first low voltage is higher than the second and third low voltages, and the second low voltage is equal to or lower than the third low voltage,
    wherein the third current is less than the second current and greater than the first current.

9. The nonvolatile memory apparatus according to claim 6, wherein:
    a difference between the first high voltage and the first low voltage corresponds to the preselection voltage;
    a difference between the second high voltage and the second low voltage corresponds to the reset write voltage; and
    a difference between the third high voltage and the third low voltage corresponds to the set write voltage.

10. The nonvolatile memory apparatus according to claim 1, wherein the preselection voltage corresponds to a reset distribution maximum voltage.

11. An operating method of a nonvolatile memory apparatus, the operating method comprising:
    applying a preselection voltage to a selected memory cell, the preselection voltage corresponding to a reset distribution maximum voltage;
    sensing whether the selected memory cell was snapped back; and
    selectively performing a reset write operation and a set write operation on the selected memory cell, based on write data and whether the selected memory cell was snapped back, and interrupting the preselection voltage applied to the selected memory cell.

12. The operating method according to claim 11, wherein selectively performing a reset write operation and a set write operation comprises performing one of the reset write operation and the set write operation on the selected memory cell based on the write data, when the selected memory cell was snapped back.

13. The operating method according to claim 11, wherein selectively performing a reset write operation and a set write operation comprises applying no voltage and no current to the selected memory cell, when the selected memory cell is not snapped back.

14. A nonvolatile memory apparatus comprising:
a write control circuit configured to:
generate a preselection signal based on a write signal;
generate one of a reset write signal and a set write signal, when a sensing signal is enabled; and
disable the preselection signal and generate none of the reset write signal and the set write signal, when the sensing signal is disabled;
a sense amplifier configured to sense whether a memory cell was snapped back and generate the sensing signal; and
a write driver configured to:
perform a preselection operation on a selected memory cell based on the preselection signal;
perform a reset write operation on the selected memory cell based on the reset write signal; and
perform a set write operation on the selected memory cell based on the set write signal.

15. The nonvolatile memory apparatus according to claim 14, wherein the write control circuit comprises:
a write pulse generator configured to generate a reset pulse signal and a set pulse signal based on the write signal;
a reset write signal generator configured to generate the reset write signal based on the reset pulse signal, the write data, and the sensing signal;
a set write signal generator configured to generate the set write signal based on the set pulse signal, the write data, and the sensing signal; and
a preselection signal generator configured to generate the preselection signal based on at least one of the write signal, the reset pulse signal and the set pulse signal.

16. The nonvolatile memory apparatus according to claim 14, wherein the write driver is configured to:
provide a preselection voltage and a first current to the selected to memory cell based on the preselection signal;
provide a reset write voltage and a second current to the selected memory cell based on the reset write signal; and
provide a set write voltage and a third current to the selected memory cell based on the set write signal.

17. The nonvolatile memory apparatus according to claim 16, wherein the preselection voltage is lower than the reset write voltage and higher than the set write voltage,
wherein the third current is greater than the first current and less than the second current.

18. The nonvolatile memory apparatus according to claim 15, wherein the preselection voltage corresponds to a reset distribution maximum voltage.

19. The nonvolatile memory apparatus according to claim 14, wherein the write driver comprises:
a first global control circuit configured to apply one of a first high voltage, a second high voltage and a third high voltage to a first global electrode coupled to the selected memory cell based on the preselection signal, the reset write signal, and the set write signal; and
a second global control circuit configured to apply one of a first low voltage, a second low voltage, and a third low voltage to a second global electrode coupled to the selected memory cell based on the preselection signal, the reset write signal, and the set write signal, and configured to control one of a first current, a second current, and a third current to flow through the second global electrode.

20. The nonvolatile memory apparatus according to claim 19, wherein the first high voltage is lower than the second high voltage and higher than the third high voltage,
wherein the first low voltage is higher than the second and third low voltages, and the second low voltage is equal to or lower than the third low voltage,
wherein the third current is less than the second current and greater than an amount of the first current.

* * * * *